United States Patent
Kim et al.

(10) Patent No.: US 9,281,437 B2
(45) Date of Patent: Mar. 8, 2016

(54) LIGHT EMITTING DEVICE, AND METHOD FOR FABRICATING THE SAME

(71) Applicant: LG INNOTEK CO., LTD., Seoul (KR)

(72) Inventors: Dong Wook Kim, Seoul (KR); June O Song, Seoul (KR); Rak Jun Choi, Seoul (KR); Jeong Tak Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/414,163

(22) PCT Filed: Apr. 19, 2013

(86) PCT No.: PCT/KR2013/003349
§ 371 (c)(1),
(2) Date: Jan. 12, 2015

(87) PCT Pub. No.: WO2014/010816
PCT Pub. Date: Jan. 16, 2014

(65) Prior Publication Data
US 2015/0214422 A1    Jul. 30, 2015

(30) Foreign Application Priority Data

Jul. 13, 2012   (KR) .................. 10-2012-0076594

(51) Int. Cl.
| | |
|---|---|
| *H01L 33/00* | (2010.01) |
| *H01L 33/14* | (2010.01) |
| *H01L 33/04* | (2010.01) |
| *H01L 33/12* | (2010.01) |
| *H01L 33/32* | (2010.01) |
| *H01L 33/06* | (2010.01) |

(52) U.S. Cl.
CPC ........ *H01L 33/0025* (2013.01); *H01L 33/0075* (2013.01); *H01L 33/04* (2013.01); *H01L 33/12* (2013.01); *H01L 33/145* (2013.01); *H01L 33/32* (2013.01); *H01L 33/06* (2013.01); *H01L 2224/48091* (2013.01)

(58) Field of Classification Search
CPC ... H01L 33/0025; H01L 33/12; H01L 33/145; H01L 33/04; H01L 33/0075; H01L 33/32; H01L 2224/48091
See application file for complete search history.

(56) References Cited

U.S. PATENT DOCUMENTS

| | | | | |
|---|---|---|---|---|
| 6,060,335 | A  * | 5/2000 | Rennie et al. | 438/46 |
| 8,053,756 | B2 * | 11/2011 | Nakahara et al. | 257/13 |
| 9,000,460 | B2 * | 4/2015 | Kim et al. | 257/94 |
| 2007/0096077 | A1 * | 5/2007 | Sanga et al. | 257/13 |
| 2007/0110112 | A1 * | 5/2007 | Sugiura | 372/43.01 |

(Continued)

FOREIGN PATENT DOCUMENTS

| KR | 10-2009-0051333 A | 5/2009 |
|---|---|---|
| KR | 10-2009-0102203 A | 9/2009 |
| KR | 10-1012515 B1 | 2/2011 |

*Primary Examiner* — Nikolay Yushin
(74) *Attorney, Agent, or Firm* — Birch, Stewart, Kolasch & Birch, LLP

(57) ABSTRACT

Disclosed are a light emitting device, a method of fabricating the light emitting device, a light emitting device package, and a lighting system. The light emitting device includes a first conductive semiconductor layer, an active layer on the first conductive semiconductor layer, an electron blocking layer on the active layer, and a second conductive semiconductor layer on the electron blocking layer. The electron blocking layer includes a first electron blocking layer and an interrupted diffusion layer on the first electron blocking layer.

17 Claims, 5 Drawing Sheets

(56) References Cited

U.S. PATENT DOCUMENTS

| | | |
|---|---|---|
| 2008/0025360 A1 | 1/2008 | Eichler et al. |
| 2009/0050875 A1 | 2/2009 | Kim et al. |
| 2009/0101927 A1* | 4/2009 | Kohda ............................ 257/97 |
| 2009/0166607 A1 | 7/2009 | Nakahara et al. |
| 2009/0242870 A1 | 10/2009 | Kim et al. |
| 2010/0187550 A1* | 7/2010 | Reed et al. ...................... 257/98 |
| 2013/0134475 A1* | 5/2013 | Han et al. ...................... 257/101 |
| 2013/0146842 A1* | 6/2013 | Kim et al. ...................... 257/13 |

\* cited by examiner

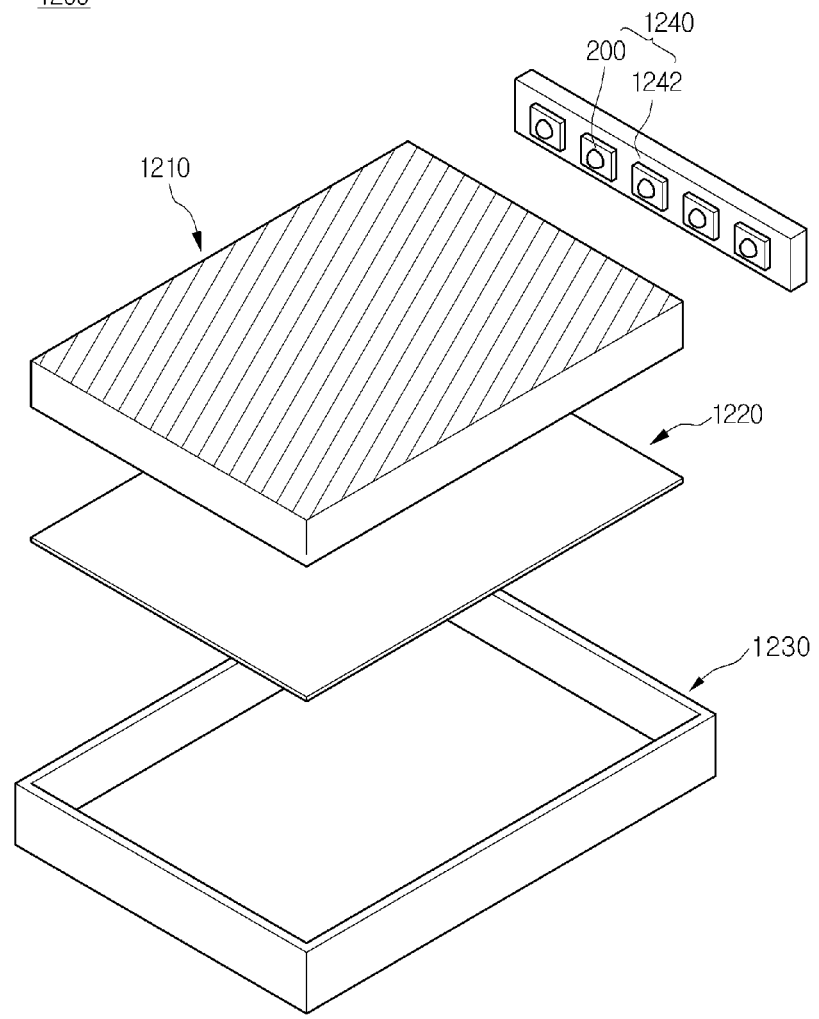

LIGHT EMITTING DEVICE, AND METHOD FOR FABRICATING THE SAME

TECHNICAL FIELD

The embodiment relates to a light emitting device, a method of fabricating the light emitting device, a light emitting device package, and a lighting system.

BACKGROUND ART

The embodiment relates to a light emitting device, a light emitting device package, and a lighting system.

A light emitting device (LED) includes a p-n junction diode having a characteristic of converting electric energy into light energy. The p-n junction diode can be formed by combining group III-V elements of the periodic table. The LED can represent various colors by adjusting the compositional ratio of compound semiconductors.

When forward voltage is applied to the LED, electrons of an n layer are combined with holes of a p layer, so that energy corresponding to an energy gap between a conduction band and a valance band may be generated. This energy is realized as heat or light, and the LED emits the energy in the form of light.

A nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been developed and extensively used.

Nitride semiconductor light emitting devices may be classified into lateral type light emitting devices and vertical type light emitting devices according to the positions of electrode layers.

In the lateral type light emitting device, a nitride semiconductor layer is formed on a sapphire substrate, and two electrode layers are disposed on the nitride semiconductor layer.

The light emitting device emits light through the recombination of electrons produced in an n type structure and holes produced in a p type structure.

Meanwhile, since an electron has a mass and mobility greater than those of a hole, the overflow of electrons is prevented by using an electron blocking layer including a material, such as p type AlGaN, representing a high potential barrier.

Meanwhile, in order to allow the LED to emit light, the concentration of holes is important more than that of electrons. However, the incorporation of magnesium (Mg) is competitively performed under the environment having a higher Al content of an electron blocking region, so that the level of Mg becomes lowered in the initial stage of growing a p type electron blocking layer, which is called an Al memory-effect. The Al memory-effect serves as one of primary causes of interrupting hole injection into the electron blocking layer, thereby degrading light efficiency.

DISCLOSURE OF INVENTION

Technical Problem

The embodiment provides a light emitting device capable of enhancing light efficiency, a method of fabricating the light emitting device, a light emitting device package, and a lighting system.

Solution to Problem

According to the embodiment, there is provided a light emitting device. The light emitting device may include a first conductive semiconductor layer, an active layer on the first conductive semiconductor layer, an electron blocking layer on the active layer, and a second conductive semiconductor layer on the electron blocking layer. The electron blocking layer includes a first electron blocking layer and an interrupted diffusion layer on the first electron blocking layer.

In addition, according to the embodiment, there is provided a light emitting device. The light emitting device may include a first conductive semiconductor layer, an active layer on the first conductive semiconductor layer, an electron blocking layer on the active layer, and a second conductive semiconductor layer on the electron blocking layer. A plurality of interrupted diffusion layers are provided in the electron blocking layer.

Further, according to the embodiment, there is provided a method of fabricating a light emitting device. The method may include forming a first conductive semiconductor layer, forming an active layer on the first conductive semiconductor layer, forming an electron blocking layer on the active layer, and forming a second conductive semiconductor layer on the electron blocking layer. The forming of the electron blocking layer includes an interrupted diffusion.

Advantageous Effects of Invention

As described above, according to the light emitting device, a method of fabricating the light emitting device, the light emitting device package, and the lighting system of the embodiment, the electron blocking function can be improved and the hole injection efficiency can be enhanced, so that the light efficiency can be significantly improved.

BRIEF DESCRIPTION OF DRAWINGS

FIGS. 6 to 8 are sectional views illustrating a lighting apparatus according to the embodiment.

BEST MODE FOR CARRYING OUT THE INVENTION

Reference will now be made in detail to the embodiments of the present disclosure, examples of which are illustrated in the accompanying drawings.

In the description of embodiments, it will be understood that when a layer (or film) is referred to as being on another layer or substrate, it can be directly on another layer or substrate, or intervening layers may also be present. Further, it will be understood that when a layer is referred to as being under another layer, it can be directly under another layer, and one or more intervening layers may also be present. In addition, it will also be understood that when a layer is referred to as being between two layers, it can be the only layer between the two layers, or one or more intervening layers may also be present.

Embodiment

Figure 1:
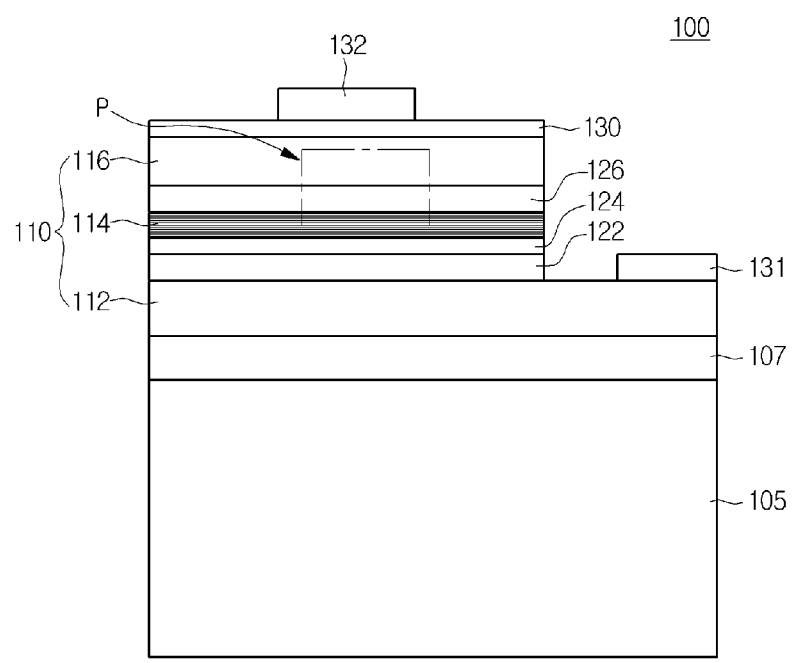
FIG. 1 is a sectional view illustrating a light emitting device according to the embodiment.
Figure 2:
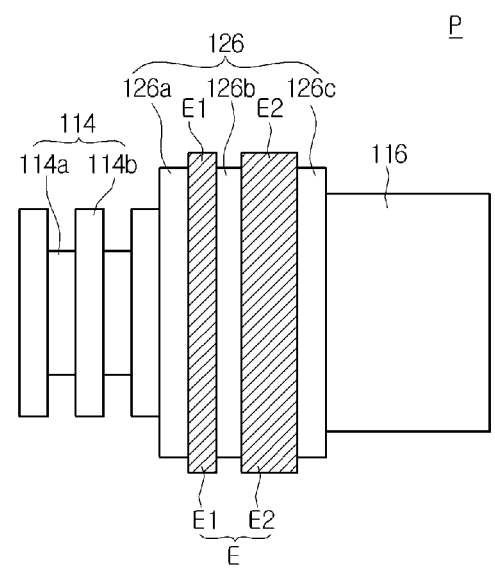
FIG. 2 is an enlarged view illustrating a part of the light emitting device according to the embodiment.

FIG. 1 is a sectional view illustrating a light emitting device 100 according to the embodiment, and FIG. 2 is an enlarged view illustrating a part P of the light emitting device 100 according to the embodiment.

The light emitting device 100 according to the embodiment may include a first conductive semiconductor layer 112, an active layer 114 on the first conductive semiconductor layer 112, an electron blocking layer 126 on the active layer 114, and a second conductive semiconductor layer 116 on the electron blocking layer 126. The electron blocking layer 126 may be provided therein with an interrupted diffusion layer E.

According to the embodiment, the first conductive semiconductor layer 112, the active layer 114, and the second conductive semiconductor layer 116 may constitute a light emitting structure 110. The light emitting structure 110 may be formed on a predetermined substrate 105.

The substrate 105 may include a material representing superior thermal conductivity. The substrate 105 may include a conductive substrate or an insulating substrate. For example, the substrate 105 may include at least one of sapphire ($Al_2O_3$), SiC, Si, GaAs, GaN, ZnO, GaP, InP, Ge, and $Ga_2O_3$.

According to the embodiment, the substrate 105 may be provided thereon with a buffer layer 107 and an undoped semiconductor layer (not shown) to reduce the lattice mismatching between the material constituting the light emitting structure 110 and the substrate 105. The buffer layer 107 may include a group III-V compound semiconductor. For instance, the buffer layer 107 may include at least one of GaN, InN, AlN, InGaN, AlGaN, InAlGaN, and AlInN, but the embodiment is not limited thereto.

According to the embodiment, the first conductive semiconductor layer 112 may include a semiconductor compound. The first conductive semiconductor layer 112 may be realized by using a group III-V compound semiconductor or a group II-IV compound semiconductor. The first conductive semiconductor layer 112 may be doped with first conductive type dopants. If the first conductive semiconductor layer 112 is an n type semiconductor layer, the first conductive dopants include N type dopants such as Si, Ge, Sn, Se, and Te, but the embodiment is not limited thereto.

For instance, the first conductive semiconductor layer 112 may include a semiconductor material having the compositional formula of $In_xAl_yGa_{1-x-y}N$ ($0 \leq x \leq 1$, $0 \leq y \leq 1$, and $0 \leq x+y \leq 1$). For instance, the first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP.

According to the embodiment, the first conductive semiconductor layer 112 may be provided thereon with a current spreading layer (not shown), for example, an undoped GaN layer.

In addition, according to the embodiment, the current spreading layer may be provided thereon with an electron injection layer 122, for example, a first conductive gallium nitride layer, so that electrons may be efficiently injected.

In addition, according to the embodiment, the electron injection layer 122 is formed thereon with a strain relief layer 124 (for example, a strain relief layer including $In_xAl_yGa_{(1-x-y)}N$ ($0 \leq x \leq 1$, $0 \leq y \leq 1$)/GaN) to effectively relieve the strain caused by the lattice mismatching between the first conductive semiconductor layer 112 and the active layer 114.

In addition, as the strain relief layer 124 has compositions, such as first $In_{x1}GaN$ and second $In_{x2}GaN$, which are repeatedly laminated by at least six periodicities, more many electrons are collected at a low energy level of the active layer 114. Accordingly, the recombination probability of electrons and holes is increased, so that light emission efficiency can be improved.

Next, the strain relief layer 124 is formed thereon with the active layer 114.

The active layer 114 may include at least one of a single quantum well structure, a multiple quantum well (MQW) structure, a quantum-wire structure and a quantum dot structure. For instance, the active layer 114 may have the MQW structure formed by injecting TMGa gas, $NH_3$ gas, $N_2$ gas, and trimethyl indium (TMIn) gas, but the embodiment is not limited thereto.

A well layer 114a/barrier layer 114b of the active layer 114 may have a pair structure including at least one of InGaN/GaN, InGaN/InGaN, GaN/AlGaN, InAlGaN/GaN, GaAs(InGaAs)/AlGaAs, and GaP(InGaP)/AlGaP, but the embodiment is not limited thereto. The well layer may include a material having band gap lower than that of the barrier layer.

According to the embodiment, the electron blocking layer 126 is formed on the active layer 114 to perform an electron blocking function and an MQW cladding function of the active layer 114, so that the light emission efficiency can be improved.

The electron blocking layer 126 may be formed thereon with the second conductive semiconductor layer 116. The second conductive semiconductor layer 116 may include a semiconductor compound. The second conductive semiconductor layer 116 may be realized by using a group III-V compound semiconductor or a group II-IV compound semiconductor, and may be doped with second conductive type dopants.

For instance, the second conductive semiconductor layer 116 may include a semiconductor material having the compositional formula of $In_xAl_yGa_{1-x-y}N$ ($0 \leq x \leq 1$, $0 \leq y \leq 1$, and $0 \leq x+y \leq 1$). If the second conductive semiconductor layer 116 is a P type semiconductor layer, the second conductive dopants may include P type dopants such as Mg, Zn, Ca, Sr, and Ba.

According to the embodiment, the first conductive semiconductor layer 112 may include an N type semiconductor layer and the second conductive semiconductor layer 116 may include a P type semiconductor layer, but the embodiment is not limited thereto.

In addition, a semiconductor layer, such as an N type semiconductor layer (not illustrated) having polarity opposite to that of the second conductive semiconductor layer 116, may be formed on the second conductive semiconductor layer 116. Thus, the light emitting structure 110 may include one of an n-p junction structure, a p-n junction structure, an n-p-n junction structure, and a P-N-P junction structure.

Hereinafter, features of the light emitting device according to the embodiment will be described in more detail with reference to FIG. 2.

Meanwhile, in order to allow the LED to emit light in the light emitting device, the concentration of holes is important more than that of electrons. However, according to the related art, the incorporation of magnesium (Mg) is competitively performed under the environment having a higher Al content of an electron blocking region, so that the level of Mg becomes lower in the initial stage of growing a P type electron blocking layer, which is called an Al memory-effect. The Al memory-effect serves as one of primary causes of interrupting hole injection into the electron blocking layer, thereby degrading light efficiency.

Therefore, according to the light emitting device of the embodiment, the interrupted diffusion layer E is provided in the electron blocking layer 126 so that the concentration of Mg ions is more increased as compared with that of the related art, thereby increasing hole injection and improving the uniformity of the concentrations of Al ions and Mg ions in a product.

For instance, according to the embodiment, one interrupted diffusion layer E or a plurality of interrupted diffusion layers E may be provided in the electron blocking layer 126.

For instance, the interrupted diffusion layer E may be provided at a single layer, or may include a first interrupted diffusion layer E1 interposed between first and second electron blocking layers 126a and 126b, and a second interrupted diffusion layer E2 interposed between the second electron blocking layer 126b and a third electron blocking layer 126c, but the embodiment is not limited thereto.

According to the embodiment, the electron blocking layer 126 may include a semiconductor based on $Al_xIn_yGa_{(1-x-y)}N$ ($0 \leq x \leq 1$ and $0 \leq y \leq 1$), and may have the energy band gap higher than the energy band gap of the active layer 114. The electron blocking layer 126 may have the thickness of about 100 Å to about 600 Å but the embodiment is not limited thereto.

In addition, the electron blocking layer 126 may include an $Al_zGa_{(1-z)}N/GaN$ ($0 \leq z \leq 1$) superlattice layer, but the embodiment is not limited thereto.

In addition, a P type ion is implanted into the electron blocking layer 126 to efficiently block overflowed electrons and enhance injection efficiency of holes. An Mg ion is implanted into the electron blocking layer 126 at the concentration in the range of about $10^{18}/cm^3$ to about $10^{20}/cm^3$ to efficiently block overflowed electrons and enhance injection efficiency of holes.

Figure 3:
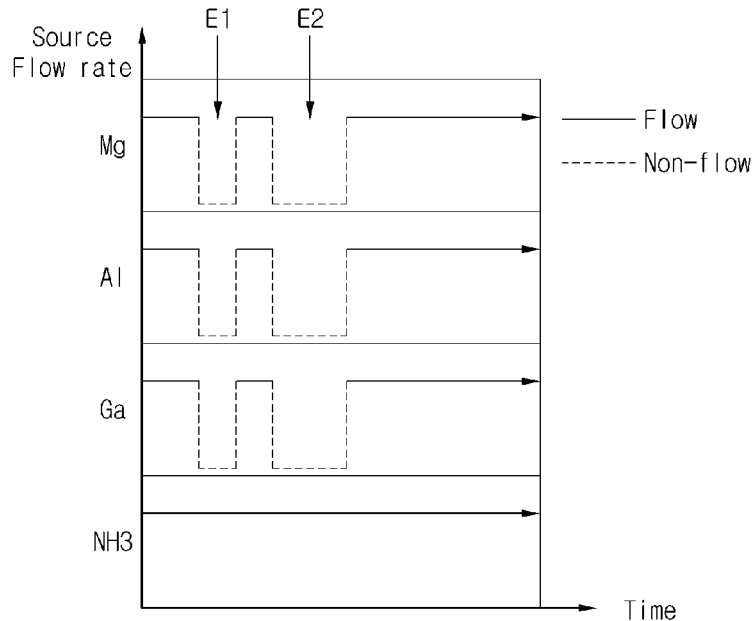
FIG. 3 is a view illustrating a portion of the fabrication process in the method of fabricating the light emitting device according to the embodiment.

FIG. 3 is a view illustrating a process of forming the electron blocking layer 126 in the method of fabricating the light emitting device according to the embodiment.

According to the embodiment, the step of forming the interrupted diffusion layer E may be defined as a process of forming the electron blocking layer performed in the state of temporarily stopping the supply of at least one of sources used to form the electron blocking layer for a predetermined time during the process of forming the electron blocking layer 126.

For instance, in the step of forming the interrupted diffusion layer E, the process of forming the electron blocking layer may be performed in the state that the supply of a gallium (Ga) source, an aluminum (Al) source, and a p-type doping source is temporarily stopped, and ammonia ($NH_3$) serving as a nitrogen (N) source is supplied for a predetermined time during the process of forming the electron blocking layer 126.

The step of forming the interrupted diffusion layer E may be performed at least one time during the process of forming the electron blocking layer.

For example, as illustrated in FIG. 3, the interrupted diffusion layer E may include the first and second interrupted diffusion layers E1 and E2, but the embodiment is not limited thereto.

Figure 4:
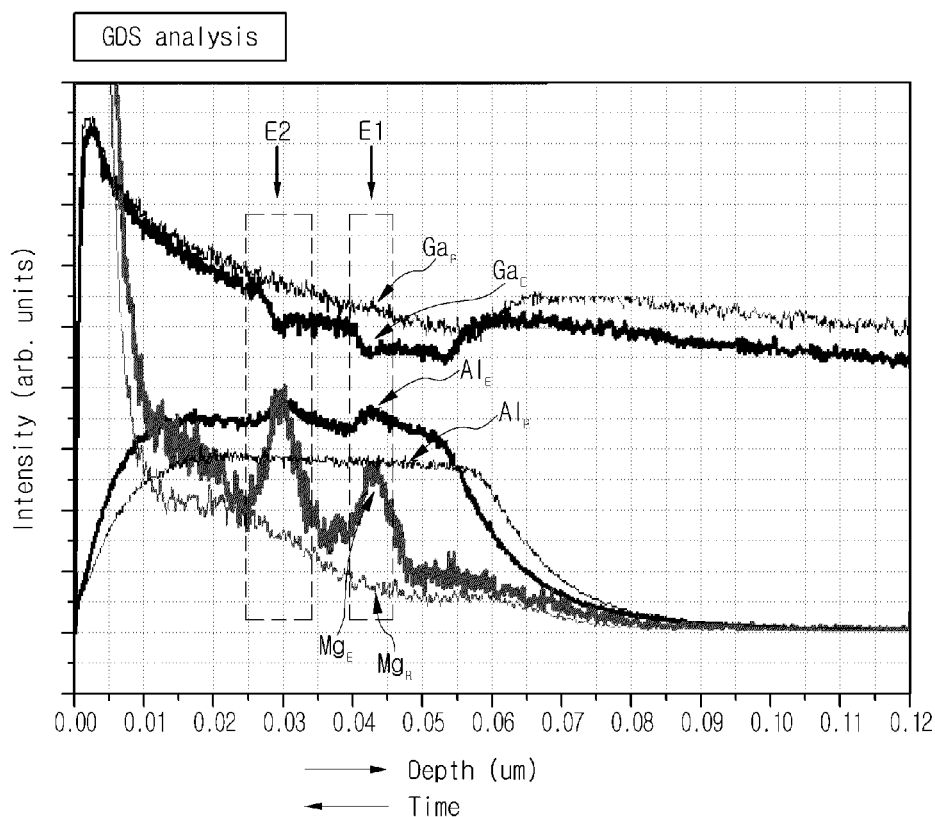
FIG. 4 is a view illustrating a glow discharge spectroscopy (GDS) of the light emitting device according to the embodiment.

FIG. 4 is a view illustrating a glow discharge spectroscopy (GDS) of the light emitting device according to the embodiment. As illustrated in FIG. 4, a right direction of an X axis represents a depth in a direction from the second conductive semiconductor layer 116 to the electron blocking layer 126, and a left direction of the X axis refers to a direction from the active layer 114 to the second conductive semiconductor layer 116, and represents data based on the process time.

According to the embodiment, the maximum concentration of a P type doping element (e.g., Mg) of the electron blocking layer 126 may be acquired in an interrupted diffusion step.

For example, the Mg concentration ($Mg_E$) in the first interrupted diffusion layer E1 or the second interrupted diffusion layer E2 according to the embodiment has a higher value than the Mg concentration ($Mg_R$) of the related art, and the maximum Mg doping concentration can be obtained from the interrupted diffusion layer E.

For example, if the interrupted diffusion layer is a single layer, the Mg concentration of the single interrupted diffusion layer represents the maximum value within the electron blocking layer. As illustrated in FIG. 4, if two interrupted diffusion layers are provided, the maximum Mg concentration value may be represented in the second interrupted diffusion layer E2 adjacent to the second conductive semiconductor layer 116, but the embodiment is not limited thereto.

According to the embodiment, the Mg concentration is increased by at least 30% as compared with that of the related art, thereby improving hole injection so that the light emission efficiency may be significantly increased.

In addition, according to the embodiment, the Al concentration ($Al_E$) in the first interrupted diffusion layer E1 or the second interrupted diffusion layer has a higher value than the Al concentration ($Al_R$) of the related art, and the maximum Al concentration can be obtained from the interrupted diffusion layer E.

For example, if the interrupted diffusion layer is a single layer, the Al concentration of the single interrupted diffusion layer represents the maximum value within the electron blocking layer. As illustrated in FIG. 4, if two interrupted diffusion layers are provided, the maximum Al concentration value may be represented in the second interrupted diffusion layer E2 adjacent to the second conductive semiconductor layer 116, but the embodiment is not limited thereto.

According to light emitting device of the embodiment, the electron blocking function can be improved, and hole injection efficiency can be enhanced, so that light efficiency can be significantly improved.

For example, according to the embodiment, the interrupted diffusion process is introduced, so the interrupted diffusion layer E is provided in the electron blocking layer 126, so that a competitively-growing mode is changed to increase the Mg concentration. Accordingly, the hole injection concentration is increased, so that the intensity of light can be improved.

In addition, according to the embodiment, as illustrated in FIG. 4, as the composition level of Al can be increased in the actual structure without additionally supplying Al, the band gap energy level can be increased, so that the electron blocking function can be more improved.

In detail, according to the related art, the Al concentration is increased, the Mg concentration is lowered, which is called an Al memory effect. However, according to the embodiment, the out-diffusion phenomenon of Mg occurs by employing the interrupted diffusion process, so that the Mg concentration is increased with the increase of Al concentration unlike the typical process.

Accordingly, the electron blocking efficiency is more enhanced due to the higher Al concentration, and the hole injection efficiency is more improved due to the Mg concentration increased by 30%. Therefore, the electron blocking function can be improved, and the hole injection efficiency can be enhanced, so that the light efficiency can be significantly increased.

Referring to FIG. 1 again, according to the embodiment, a transmissive electrode 130 is formed on the second conductive semiconductor layer 116, so that the transmissive electrode 130 may include a transmissive ohmic layer. The transmissive ohmic layer may be formed by laminating single metal, or may be formed by laminating a metal alloy and metal oxide in a multi-layer such that carrier injection may be efficiently performed.

For instance, the transmissive electrode 130 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, and NiO, but the embodiment is not limited thereto.

According to the embodiment, after removing portions of the transmissive electrode 130, the second conductive semiconductor layer 116, the active layer 114, the electron injection layer 122, and the strain relief layer 124 so that the first conductive semiconductor layer 112 is exposed, the second electrode 132 is formed on the transmissive electrode 130, and the first electrode 132 is formed on the exposed first conductive semiconductor layer 112.

According to the light emitting device, the method of fabricating the light emitting device, the light emitting device package, and the lighting system of the embodiment, the electron blocking function can be improved, and the hole injection efficiency can be enhanced, so that the light efficiency can be significantly improved.

Figure 5:
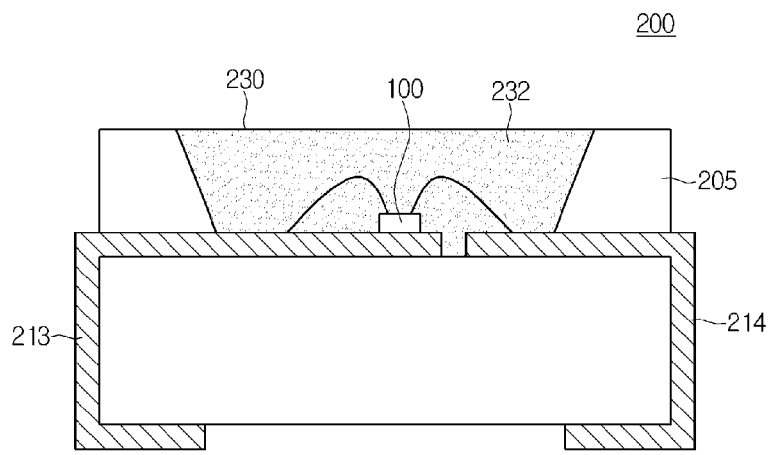
FIG. 5 is a sectional view illustrating a light emitting device package according to the embodiment.

FIG. 5 is a view showing a light emitting device package 200 in which a light emitting device according to the embodiments is installed.

The light emitting device package 200 according to the embodiment includes a package body 205, third and second lead electrodes 213 and 214 formed on the package body 205, the light emitting device 100 according to the embodiment, which is installed in the package body 205 and electrically connected to the third and second lead electrodes 213 and 214, and a molding member 230 surrounding the light emitting device 100.

The package body 205 may include silicon, synthetic resin, or metallic material. An inclined surface may be formed around the light emitting device 100.

The third and fourth lead electrodes 213 and 214 are electrically insulated from each other and supply power to the light emitting device 100. The third and second lead electrodes 213 and 214 may reflect light emitted from the light emitting device 100 to increase light efficiency, and may dissipate heat generated from the light emitting device 100 to the outside.

The light emitting device 100 may include a lateral type light emitting device shown in FIG. 1, but the embodiment is not limited thereto. In addition, the light emitting device 100 may include a vertical type light emitting device.

The light emitting device 100 may be mounted on the package body 205 or on the third lead electrode 213 or the fourth lead electrode 214.

The light emitting device 100 may be electrically connected with the third lead electrode 213 and/or the fourth lead electrode 214 through one of a wire scheme, a flip chip scheme and a die bonding scheme. Although FIG. 5 shows that the light emitting device 100 is electrically connected with the third lead electrode 213 and the fourth lead electrode 214 through a wire, the embodiment is not limited thereto.

The molding member 230 may protect the light emitting device 100 by surrounding the light emitting device 100. In addition, the molding member 230 may include phosphors (232) to change the wavelength of light emitted from the light emitting device 100.

Figure 6:
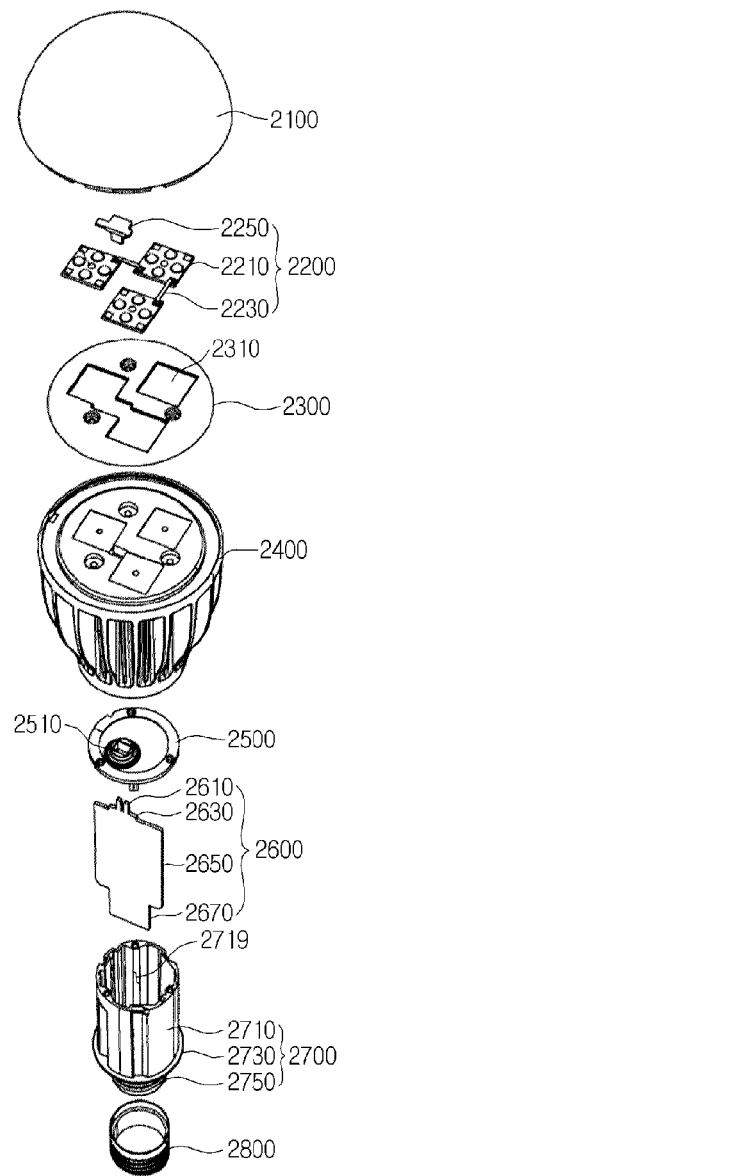
Figure 7:
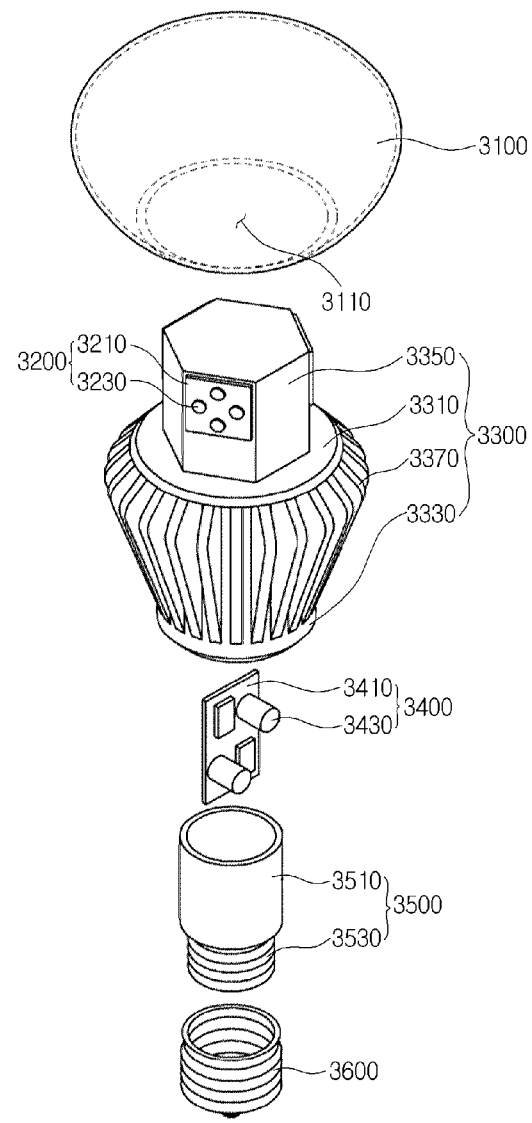

FIGS. 6 to 8 are exploded perspective views showing examples of a lighting system including a light emitting device according to the embodiment.

As shown in FIG. 6, the lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device module 200 according to the embodiment.

For example, the cover 2100 may have a bulb shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 3100 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion 2610 of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650.

For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a + electric wire and a − electric wire are electrically connected to the extension part 2670 and second terminals of the + electric wire and the − electric wire may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

As shown in FIG. 7, the lighting system according to the embodiment may include a cover 3100, a light source part 3200, a radiator 3300, a circuit part 3400, an inner case 3500, and a socket 3600. The light source part 3200 may include the light emitting device or the light emitting device module according to the embodiment.

The cover 3100 may have a bulb shape and is hollow. The cover 3100 has an opening 3110. The light source part 3200 and a member 3350 may be inserted through the opening 3110.

The cover 3100 may be coupled with the radiator 3300, and may surround the light source part 3200 and the member 3350. The light source part 3200 and the member 3350 may be blocked from the outside by the coupling between the cover 3100 and the radiator 3300. The cover 3100 may be coupled with the radiator 3300 by an adhesive or various schemes such as a rotation coupling scheme and a hook coupling scheme.

The rotation coupling scheme is a scheme where a thread of the cover 3100 is coupled with a screw groove of the radiator 3300, and the cover 3100 is coupled with the radiator 3300 by rotation of the cover 3100. The hook coupling scheme is a scheme where a projection of the cover 3100 is inserted into a groove of the radiator 3300 so that the cover 3100 is coupled with the radiator 3300.

The cover 3100 may be optically coupled with the light source part 3200. In detail, the cover 3100 may diffuse, scatter, or excite light provided from a light emitting device 3230 of the light source part 3200. The cover 3100 may be a type of optical member. The cover 3100 may be provided at an inner/outer surface or an inside thereof with a luminescence material in order to excite the light supplied from the light source part 3200.

The cover 3100 may include an inner surface coated with a milk-white paint. The milk-white paint may include a diffusion material to diffuse light. The cover 3100 may have the inner surface of which surface roughness is greater than that of the outer surface thereof. The surface roughness is provided for the purpose of sufficiently scattering and diffusing the light from the light source part 3200.

For example, a material of the cover 3100 may include glass, plastic, polypropylene (PP), polyethylene (PE), and polycarbonate (PC). The polycarbonate (PC) has the superior light resistance, heat resistance and strength among the above materials. The cover 3100 may be transparent so that a user may view the light source module 2200 from the outside, or opaque. The cover 3100 may be formed through a blow molding scheme.

The light source part 3200 is disposed at the member 3350 of the radiator 3300, and a plurality of light source part may be disposed. In detail, the light source part 3200 may be disposed in at least one of a plurality of lateral sides of the member 3350. A top end of the light source part 3200 of the light source part 3200 may be disposed at the lateral side of the member 3350.

The light source part 3200 may be disposed at three of six lateral sides of the member 3350. However, the embodiment is not limited thereto, and the light source part 3200 may be disposed at all lateral sides of the member 3350. The light source part 3200 may include a substrate 3210 and a light emitting device 3230. The light emitting device 32030 may be disposed on one surface of the substrate 3210.

The substrate 3210 has a rectangular shape, but the embodiment is not limited thereto. The substrate 3210 may have various shapes. For example, the substrate 3210 may have a circular shape or a polygonal shape. The substrate 3210 may be provided by printing a circuit pattern on an insulator. For example, the typical printed circuit board (PCB) may include a metal core PCB, a flexible PCB, and a ceramic PCB.

In addition, the substrate may have a COB (chips on board) type in which LED chips, which are not packaged, are directly bonded on the PCB. In addition, the substrate 3210 may include a material to effectively reflect light, or the surface of the substrate may have a color such as a gold color or a silver color to effectively reflect the light. The substrate 3210 may be electrically connected to the circuit part 3400 received in the radiator 3300.

For example, the substrate 3210 and the circuit part 3400 may be connected to each other by a wire. The wire may connect the substrate 3210 and the circuit part 3400 to each other through the radiator 3300.

The light emitting device 3230 may include a light emitting diode chip to emit red, green, and blue lights or a light emitting diode chip to emit UV. The light emitting diode may have the lateral type or the vertical type. The light emitting diode may emit one of blue, red, yellow, and green lights.

The light emitting device 3230 may include a luminescence material. The luminescence material may include at least one of garnet-based phosphors (YAG, or TAG), silicate-based phosphors, nitride-based phosphors, and oxynitride-based phosphors. The luminescence material may include at least one of a red luminescence material, a yellow luminescence material and a green luminescence material.

The radiator 3300 is coupled with the cover 3100, and may radiate heat from the light source part 3200. The radiator 330 has a predetermined volume, and includes a top surface 3310 and a lateral side 3330. The member 3350 may be disposed on the top surface 3310 of the radiator 3310. The top surface 3310 of the radiator 3300 may be coupled with the cover 3100. The top surface of the radiator 3300 may have a shape corresponding to an opening 3110 of the cover 3100.

A plurality of heat radiation pins 3370 may be disposed at the lateral side 3330 of the radiator 3300. The heat radiation pin 3370 may extend outward from the lateral side of the radiator 3300 or may be connected to the lateral side of the radiator 3300. The heat radiation pin 3370 may improve heat radiation efficiency by increasing a heat radiation area of the radiator 3300. The lateral side 3330 may not include the heat radiation pin 3370.

The member 3350 may be disposed on the top surface of the radiator 3300. The member 3350 may be integrated with or coupled to the top surface 3310 of the radiator 3300. The member 3350 may have the shape of a polygonal prism. In detail, the member 3350 may have the shape of a hexagonal prism. The member 3350 having the shape of a hexagonal prism includes a top surface, a bottom surface, and six lateral sides.

The member 3350 may have the shape of a circular prism or the shape of an elliptical prism as well as the shape of a hexagonal prism. When the member 3350 has the shape of a circular prism or the shape of an elliptical prism, the substrate 3210 of the light source part 3200 may be a flexible substrate.

The light source part 3200 may be disposed at six lateral sides of the member 3350. The light source part 3200 may be disposed at all or some of the six lateral sides of the member 3350. The light source part 3200 is disposed at three of the six lateral sides of the member 3350 in FIG. 7.

The substrate 3210 is disposed at the lateral side of the member 3350. The lateral side of the member 3350 may be substantially vertical to the top surface of the radiator 3300. Accordingly, the substrate 3210 and the top surface of the radiator 3300 may be substantially vertical to each other.

The member 3350 may include a material representing thermal conductivity. Thus, heat from the light source part 3200 can be rapidly transferred to the member 3350. For example, the material for the member 3350 may include an alloy of metals such as aluminum (Al), nickel (Ni), copper (Cu), magnesium (Mg), silver (Ag), or tin (Sn). The member 3350 may include a plastic material having thermal conductivity. The plastic material having thermal conductivity is lighter than the metal and has thermal conductivity in a single direction.

The circuit part 3400 receives power from the outside, and converts the received power suitably for the light source part 3200. The circuit part 3400 provides the converted power to the light source part 3200. The circuit part 3400 may be disposed at the radiator 3300. In detail, the circuit part 3400 may be received in the inner case 3500, and may be received in the radiator 3300 together with the inner case 3500. The circuit part 3400 may include a circuit board 3410 and a plurality of components mounted on the circuit board 3410.

The circuit board 3410 has a circular shape, but the embodiment is not limited thereto. That is, the circuit board 3410 may have various shapes. For example, the circuit board may have an elliptical shape or a polygonal shape. The circuit board 3410 may be provided by printing a circuit pattern on an insulator.

The circuit board 3410 is electrically connected to the substrate 3210 of the light source part 3200. For example, the circuit part 3410 and the substrate 3210 may be connected to each other by a wire. The wire may be disposed inside the radiator 3300 to connect the substrate 3210 with the circuit board 3410.

For example, a plurality of components 3430 may include a direct current converter converting AC power provided from an external power supply into DC power, a driving chip controlling driving of the light source part 3200, and an electrostatic discharge (ESD) protective device.

The inner case 3500 receives the circuit part 3400 therein. The inner case 3500 may include a receiving part 3510 to receive the circuit part 3400.

For example, the receiving part 3510 may have a cylindrical shape. The shape of the receiving part 3510 may be changed according to the shape of the radiator 3300. The inner case 3500 may be received in the radiator 3300. The receiving part 3510 of the inner case 3500 may be received in a receiving part which is formed at a bottom surface of the radiator 3300.

The inner case 3500 may be coupled with the socket 3600. The inner case 3500 may include a connecting part 3530 coupled with the socket 3600. The connecting part 3530 may have a thread structure corresponding to a screw groove structure of the socket 3600. The inner case 3500 is an insulator. Accordingly, the inner case 3500 prevents electric short between the circuit part 3400 and the radiator 3300. For example, the inner case 3500 may include a plastic or resin material.

The socket 3600 may be coupled with the inner case 3500. In detail, the socket 3600 may be coupled with the connecting part 3530 of the inner case 3500. The socket 3600 may have the same structure as that of a conventional incandescent light bulb. The socket 3600 is electrically connected to the circuit part 3400. For example, the circuit part 3400 and the socket 3600 may be connected to each other by a wire. If external power is applied to the socket 3600, the external power may be transferred to the circuit part 3400. The socket 360 may have a screw groove structure corresponding to a thread structure of the connecting part 3550.

Further, as shown in FIG. 8, the lighting system according to the embodiment, for example, a backlight unit includes a light guide plate 1210, a light emitting module 1240 for providing the light to the light guide plate 1210, a reflective member 1220 positioned below the light guide plate 1210, and a bottom cover 1230 for receiving the light guide plate 1210, the light emitting module 1240, and the reflective member 1220 therein, but the embodiment is not limited thereto.

The light guide plate 1210 diffuses the light to provide surface light. The light guide plate 1210 includes transparent material. For instance, the light guide plate 1210 can be manufactured by using acryl-based resin, such as PMMA (polymethyl methacrylate), PET (polyethylene terephthalate), PC (polycarbonate), COC or PEN (polyethylene naphthalate) resin.

The light emitting module 1240 supplies the light to at least one lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB) as well as a typical PCB, but the embodiment is not limited thereto.

In addition, the light emitting device packages 200 are arranged on the substrate 1242 such that light exit surfaces of the light emitting device packages 200 are spaced apart from the light guide plate 1210 by a predetermined distance.

The reflective member 1220 is disposed below the light guide plate 1210. The reflective member 1220 reflects the light, which is travelled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

As described above, according to the light emitting device, a method of fabricating the light emitting device, the light emitting device package, and the lighting system of the embodiment, the electron blocking function can be improved and the hole injection efficiency can be enhanced, so that the light efficiency can be significantly improved.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment.

Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

A plurality of light emitting device packages according to the embodiment may be arrayed on the substrate and the light guide plate, the prism sheet, the diffusion sheet and the fluorescent sheet serving as optical members may be disposed on a path of light emitted from the light emitting device packages. The light emitting packages, the substrate, and the optical member may serve as the backlight unit or a lighting unit. For example, the lighting system may include the backlight unit, the lighting unit, an indicator, a lamp, or a street lamp.

The invention claimed is:

1. A light emitting device comprising:
a first conductive semiconductor layer;
an active layer on the first conductive semiconductor layer;
an electron blocking layer on the active layer; and
a second conductive semiconductor layer on the electron blocking layer,
wherein the electron blocking layer comprises a first electron blocking layer and an interrupted diffusion layer on the first electron blocking layer,
wherein a concentration of p type doping elements is maximum in the interrupted diffusion layer of the electron blocking layer, and
wherein a plurality of interrupted diffusion layers are provided in the electron blocking layer, the concentration of the p type doping elements has a maximum value in a second interrupted diffusion layer adjacent to the second conductive semiconductor layer.

2. The light emitting device of claim 1, wherein the electron blocking layer further comprises a second electron blocking layer on the interrupted diffusion layer.

3. The light emitting device of claim 2, wherein a plurality of interrupted diffusion layers are provided in the electron blocking layer.

4. The light emitting device of claim 1, wherein concentration of Al is maximum in the interrupted diffusion layer of the electron blocking layer.

5. The light emitting device of claim 4, wherein a plurality of interrupted diffusion layers are provided in the electron blocking layer, the concentration of Al has a maximum value in a second interrupted diffusion layer adjacent to the second conductive semiconductor layer.

6. The light emitting device of claim 1, wherein the electron blocking layer includes an $Al_zGa_{(1-z)}N/GaN$ ($0 \leq z \leq 1$) superlattice layer.

7. The light emitting device of claim 1, wherein the electron blocking layer has a thickness of about 100 Å to about 600 Å.

8. The light emitting device of claim 1, wherein a strain relief layer which comprising an InGaN disposed on the first semiconductor layer and repeatedly ruminated by at least six periodicities.

9. A light emitting device comprising:
a first conductive semiconductor layer;
an active layer on the first conductive semiconductor layer;
an electron blocking layer on the active layer; and
a second conductive semiconductor layer on the electron blocking layer,
wherein a plurality of interrupted diffusion layers are provided in the electron blocking layer,
wherein a concentration of p type doping elements is maximum in the interrupted diffusion layers of the electron blocking layer, and
wherein the electron blocking layer comprises:
a first electron blocking layer;
the interrupted diffusion layers on the first electron blocking layer; and
a second electron blocking layer on the interrupted diffusion layers.

10. The light emitting device of claim 9, wherein the concentration of the p type doping elements has a maximum value in a second interrupted diffusion layer adjacent to the second conductive semiconductor layer.

11. The light emitting device of claim 9, wherein a concentration of Al is maximum in the interrupted diffusion layers of the electron blocking layer.

12. The light emitting device of claim 11, wherein the concentration of Al has a maximum value in a second interrupted diffusion layer adjacent to the second conductive semiconductor layer.

13. A method of fabricating a light emitting device, the method comprising:
forming a first conductive semiconductor layer;

forming an active layer on the first conductive semiconductor layer;
forming an electron blocking layer on the active layer; and
forming a second conductive semiconductor layer on the electron blocking layer,
wherein the forming of the electron blocking layer comprises an interrupted diffusion,
wherein a maximum concentration of p type doping elements of the electron blocking layer is obtained in the interrupted diffusion, and
wherein the interrupted diffusion comprises performing a process performed in a state that supply of at least one of sources, which are used to form the electron blocking layer, is temporarily stopped for a predetermined time during the process of forming the electron blocking layer.

14. The method of claim 13, wherein, in the interrupted diffusion, the process of forming the electron blocking layer is performed in a state that supply of a gallium (Ga) source, an aluminum (Al) source, and a p type doping source is temporarily stopped, and a nitrogen source is supplied for the predetermined time during the process of forming the electron blocking layer.

15. The method of claim 14, wherein maximum concentration of Al of the electron blocking layer is obtained in the interrupted diffusion.

16. The method of claim 13, wherein the interrupted diffusion is performed at least one time during the process of forming the electron blocking layer.

17. The method of claim 13, wherein the interrupted diffusion is performed at least several times during the process of forming the electron blocking layer.

* * * * *